United States Patent [19]
Cho

[11] Patent Number: 6,100,566
[45] Date of Patent: Aug. 8, 2000

[54] MULTI-LAYER SEMICONDUCTOR DEVICE AND METHOD FOR FABRICATING THE SAME

[75] Inventor: Seok Won Cho, Chungcheongbuk-do, Rep. of Korea

[73] Assignee: LG Semicon Co., Ltd., Cheongju-si, Rep. of Korea

[21] Appl. No.: 09/157,581

[22] Filed: Sep. 21, 1998

[30] Foreign Application Priority Data

Feb. 6, 1998 [KR]  Rep. of Korea ................. 98-3430

[51] Int. Cl.⁷ .................. H01L 21/84; H01L 31/0392
[52] U.S. Cl. .................. 257/350; 438/154; 438/152
[58] Field of Search .................. 257/350, 351; 438/157, 154, 152

[56] References Cited

U.S. PATENT DOCUMENTS

| | | |
|---|---|---|
| 5,128,732 | 7/1992 | Sugahara et al. ............. 257/351 |
| 5,309,010 | 5/1994 | Kitajima ....................... 257/350 |
| 5,365,081 | 11/1994 | Yamazaki et al. ............. 257/351 |
| 5,426,315 | 6/1995 | Pfiester ......................... 257/351 |
| 5,521,401 | 5/1996 | Zamanian et al. ............. 257/530 |
| 5,563,440 | 10/1996 | Yamazaki et al. ............. 257/531 |
| 5,578,838 | 11/1996 | Cho et al. . |
| 5,612,552 | 3/1997 | Owens ........................... 257/350 |
| 5,659,183 | 8/1997 | Manning et al. . |

*Primary Examiner*—David Hardy

[57] ABSTRACT

A multi-layer semiconductor having a semiconductor substrate, a first gate electrode formed over the substrate, first source and drain electrodes in the substrate on both sides of first and second gate electrodes, the second source and drain electrodes connected to the semiconductor layer. The method includes the steps of forming the first gate electrode over the semiconductor substrate with a first insulating layer inbetween, forming the first source and the first drain electrodes in the substrate on both sides of the first gate electrodes, forming a semiconductor layer over the first gate electrode with a second insulating layer therebetween, forming a second gate electrode on the semiconductor layer, and forming second source, and drain electrodes connected to the semiconductor layer.

24 Claims, 7 Drawing Sheets

MULTI-LAYER SEMICONDUCTOR DEVICE AND METHOD FOR FABRICATING THE SAME

BACKGROUND OF THE INVENTION

1. Field of the Invention

The present invention relates to a semiconductor device, and more particularly, to a thin film transistor and a method for fabricating the same, which can improve a device reliability.

2. Background of the Related Art

In general, thin film transistors may be used in place of CMOS load transistors or load resistors in SRAM cells of 4M or 16M class or over, or as switching devices for switching video data signals from pixel regions in a liquid crystal display. Particularly, use of a PMOS thin film transistor (TFT) in the SRAM cell provides a decrease in an off-current and an increase on on-current. This reduces power consumption and improves the memory characteristics of the SRAM; therefore, providing a high quality SRAM cell.

Figure 1:
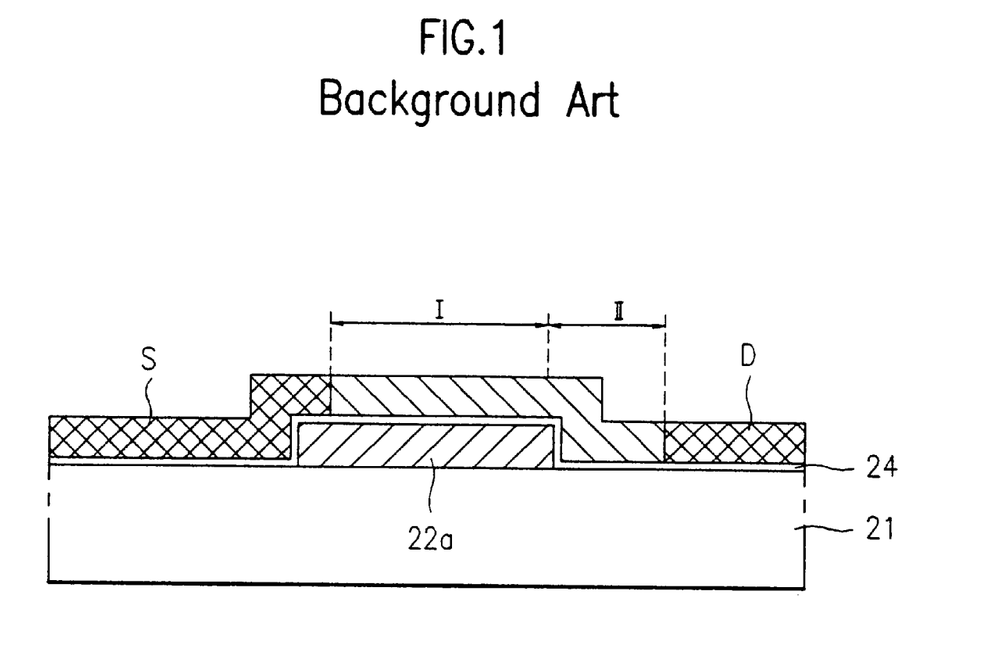
FIG. 1 illustrates a section of a background art thin film transistor.

A conventional thin film transistor and a method for fabricating the same will be explained with reference to the attached drawings. FIG. 1 illustrates a section of the conventional thin film transistor.

Referring to FIG. 1, the conventional thin film transistor is provided with an insulating layer 21, a gate electrode 22a formed on the insulating film 21, a gate insulating film 24 formed on the insulating film 21 inclusive of the gate electrode 22a, a drain electrode D formed on the gate insulating film 24 spaced from the gate electrode 22a, a source electrode S formed on the gate insulating film 24 opposite to the drain electrode D overlapped with the gate electrode 22a, and a channel region I and an offset region II formed between the source electrode S and the drain electrode D. The offset region 11 is a region between the drain region D and the gate electrode 22a.

A method for fabricating the conventional thin film transistor will be explained. FIGS. 2A–2D illustrate sections showing the steps of a background art method for fabricating a thin film transistor.

Figure 2A:
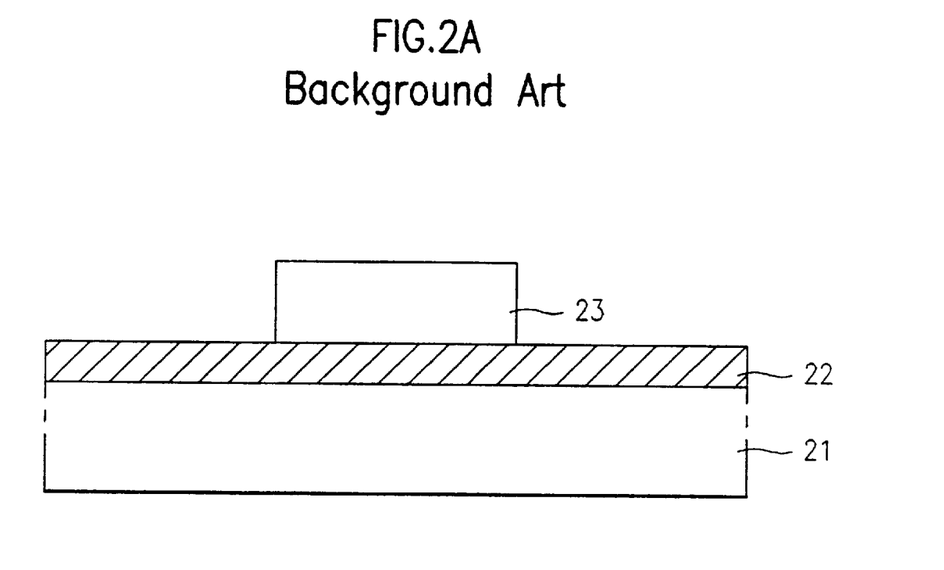
FIGS. 2A–2D illustrate sections showing the steps of a background art method for fabricating a thin film transistor.
Figure 2B:
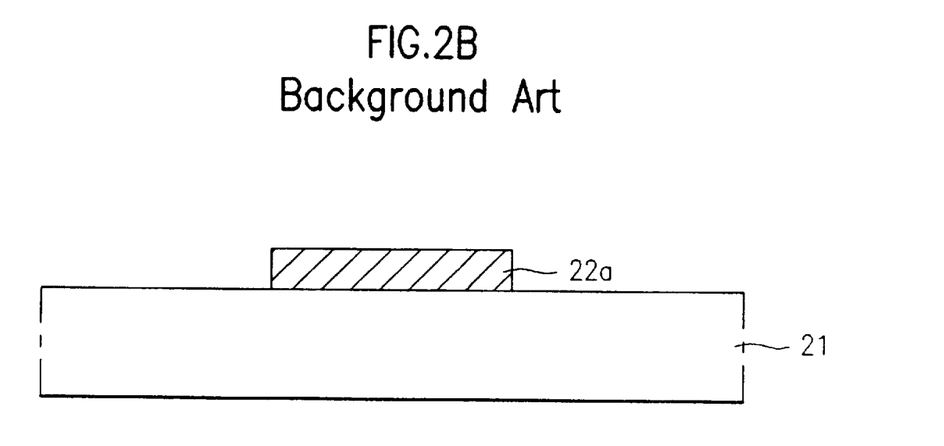
Figure 2C:
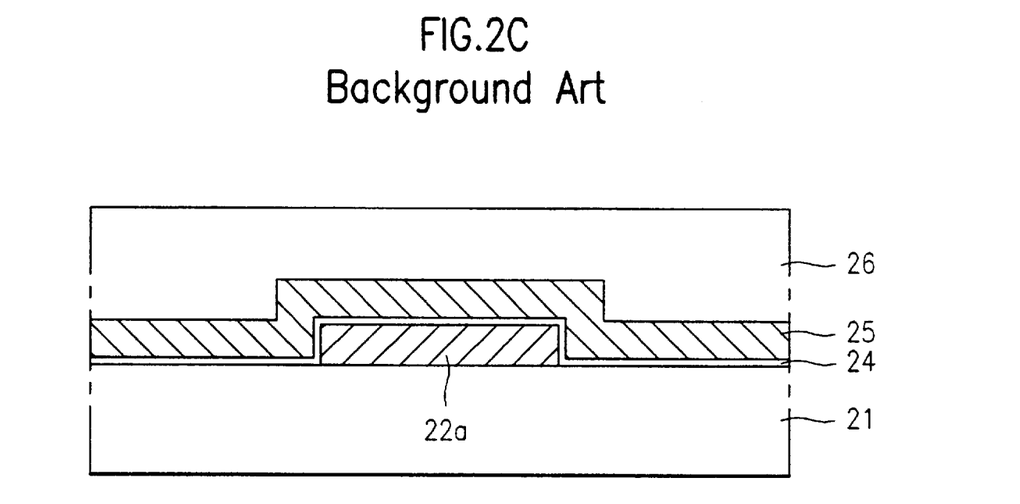
Figure 2D:
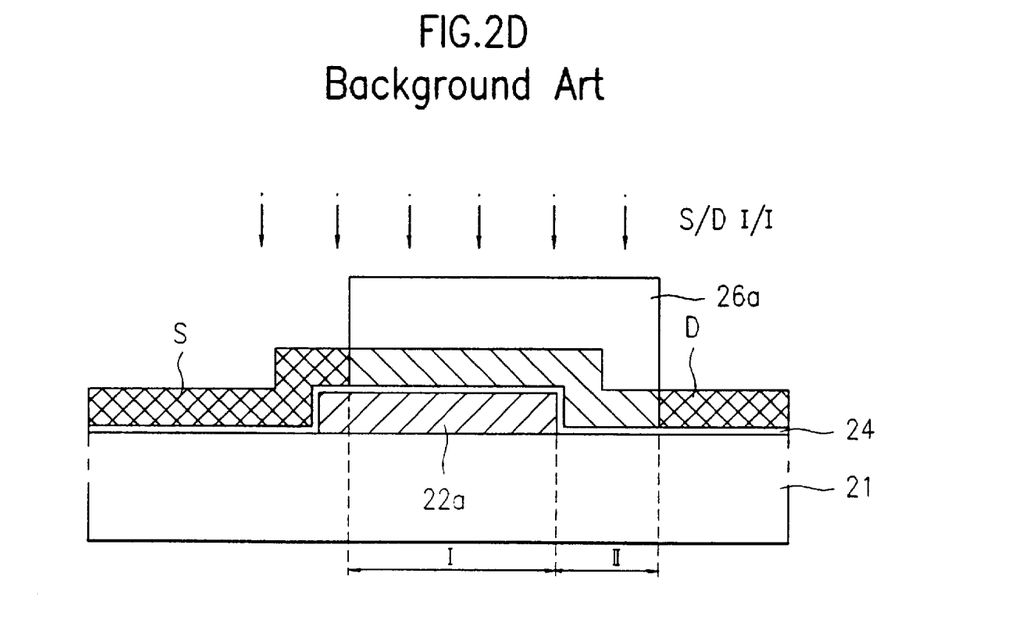

Referring to FIG. 2A, a first polysilicon layer 22 for forming a gate electrode of a bulk transistor is formed on an insulating layer 21. A photoresist film is coated on the first polysilicon layer and subjected to exposure and development, to form a mask pattern 23. The first polysilicon layer 22 is selectively etched using the mask pattern 23, to form a gate electrode 22a as shown in FIG. 2B. As shown in FIG. 2C, a gate insulating film 24 is deposited on the insulating layer 21 inclusive of the gate electrode 22a. Then a second polysilicon layer 25 to be used a source and drain electrodes, an offset region and a channel region of a thin film transistor is formed on the gate insulating film 24. A photoresist film 26 is coated on the second polysilicon layer 25 and subjected to patterning by exposure and development, such that the patterned photoresist film 26a defines a channel region and an offset region, as shown in FIG. 2D. Then, impurities for source/drain are injected into the second polysilicone layer 25 using the patterned photoresist film 26a as a mask, to form a source electrode S overlapped with the gate electrode 22a over a top portion of the gate electrode 22a and a drain electrode D spaced from the gate electrode 22a. And, a channel region I and an offset region II are formed between the source electrode S and the drain electrode D.

However, the conventional thin film transistor and method for fabricating the same have the following problems.

First, on-current is less, as the channel is formed only on one side.

Second, resistance is high, as the source/drain electrodes have a thickness identical to the channel portion.

SUMMARY OF THE INVENTION

Accordingly, the present invention is directed to a semiconductor device and a method for fabricating the same that substantially obviates one or more of the problems due to limitations and disadvantages of the related art.

An object of the present invention is to provide a semiconductor device and a method for fabricating the same, which can increase an on-current and minimize source/drain resistances.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof, as well as the appended drawings.

To achieve these and other advantages and in accordance with the purpose of the present invention, as embodied and broadly described, the semiconductor device includes a semiconductor substrate, a first gate electrode formed over the substrate, first source, and drain electrodes (i.e. regions) in the substrate on both sides of the first gate electrodes, a semiconductor layer formed over the first gate electrode, a second gate electrode over the semiconductor layer, and second source and drain electrodes at both sides of the first, and second gate electrodes, second source and drain electrodes (i.e. regions) connected to the semiconductor layer.

In another aspect of the present invention, there is provided a method for fabricating a semiconductor device including the steps of (1) forming a first gate electrode over a semiconductor substrate with a first insulating layer therebetween, (2) forming a first source and a first drain electrodes in substrate on both sides or the first gate electrodes, (3) forming a semiconductor layer over the first gate electrode with a second insulating layer in between, (4) forming a second gate electrode on the semiconductor layer, and (5) forming second source, and drain electrodes at sides of the first, and second gate electrodes, the second source, and drain electrodes connected to the semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 3:
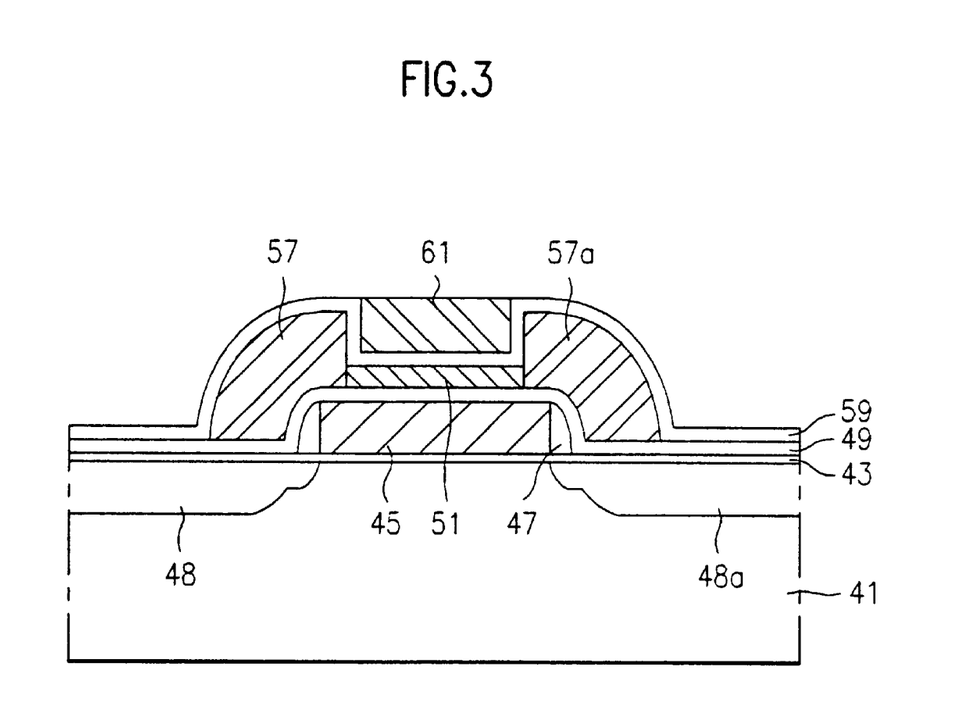
FIG. 3 illustrates a section of a thin film transistor in accordance with a preferred embodiment of the present invention.

Reference will now be made in detail to the preferred embodiments of the present invention, examples of which are illustrated in the accompanying drawings. FIG. 3 illustrates a section of a thin film transistor in accordance with a preferred embodiment of the present invention.

Referring to FIG. 3, the thin film transistor in accordance with a preferred embodiment of the present invention includes a semiconductor substrate 41, a first gate electrode 45 for a bulk transistor formed on the substrate 41 spaced from a first insulating layer 43, insulating sidewalls 47 formed at both sides of the first gate electrode 45, first source and drain electrode 48 and 48a for the bulk transistor are formed on the substrate 41 on both sides of the first gate electrodes 45, a semiconductor layer 51 formed on a second insulating film 49 over the first gate electrode 45, and a second gate electrode 61 for a thin film transistor formed on the fourth insulating layer 59 over the semiconductor layer 51 and second source and drain electrodes 57 and 57a for the thin film transistor formed at both sides of the second gate electrode 61 for the thin film transistor inclusive of the insulating sidewalls 47. The semiconductor layer 51 is a channel region both for the thin film transistor and the bulk transistor. The second source and drain electrodes 57 and 57a for the thin film transistor have a conductivity identical to the substrate 41, and the impurity regions of the first source and drain electrode 48 and 48a have a conductivity opposite to the substrate 41.

A method for fabricating the semiconductor device of the present invention will be explained with reference to the attached drawings. FIGS. 4A–4G illustrate sections showing the steps of a method for fabrication a thin firm transistor in accordance with a preferred embodiment of the present invention.

Figure 4A:
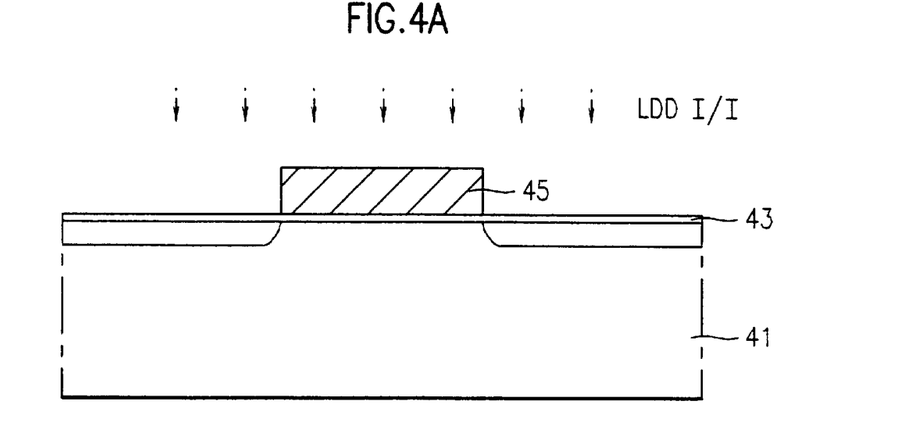
FIGS. 4A–4G illustrate sections showing the steps of a method for fabricating a thin film transistor in accordance with a preferred embodiment of the present invention.

Referring to FIG. 4A a first insulative layer 43 and a polysilicone layer are formed on a semiconductor substrate 41 in succession. The polysilicone layer is subjected to photoetching process, to remove the polysilicon layer selectively, and to form a first gate electrode 45 for a bulk transistor. An LDD ion injection is conducted using the first gate electrode 45 as a mask.

Figure 4B:
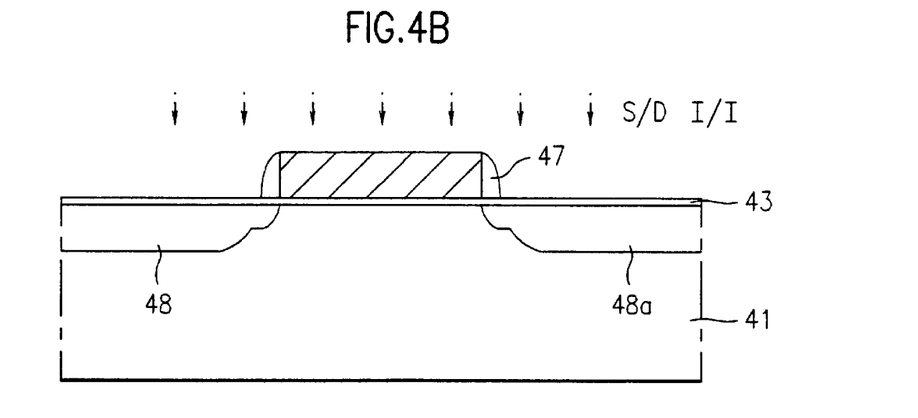

As shown in FIG. 4B an insulating film is formed on an entire surface inclusive of the first gate electrode 45 and subjected to back etching, to form insulating sidewalls 47 at both sides of the first gate electrode 45. Impurity ions are injected, using the first state electrode 45 and the insulating sidewalls 47 as masks, to form first source and drain electrodes 48 and 48a for the bulk transistor in the substrate 41 on both sides of the first gate electrode 45.

Figure 4C:
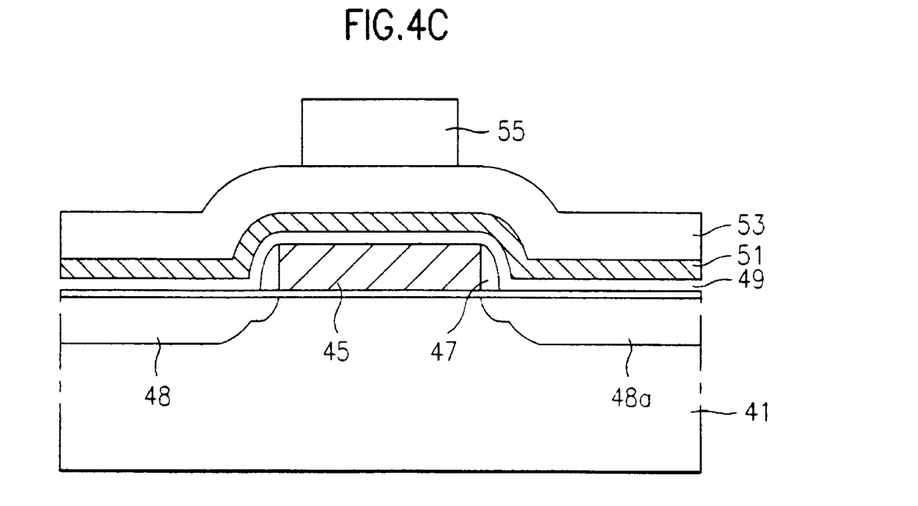

Shown in FIG. 4C, a second insulating layer 49 is formed on an entire surface of the substrate 41 inclusive of the first gate electrode 45. A semiconductor layer 51 and a third insulating layer 53 are formed on the second insulating layer 49 in succession. The semiconductor layer 51 formed of polysilicon is used as a channel region of the bulk transistor and a channel region of a thin film transistor to be formed later. The third insulating layer 53 is formed of silicon oxide. A photoresist film 55 is coated on the third insulating layer 53 and subjected to patterning, to define a region a gate electrode of the thin film transistor to be formed therein.

Figure 4D:
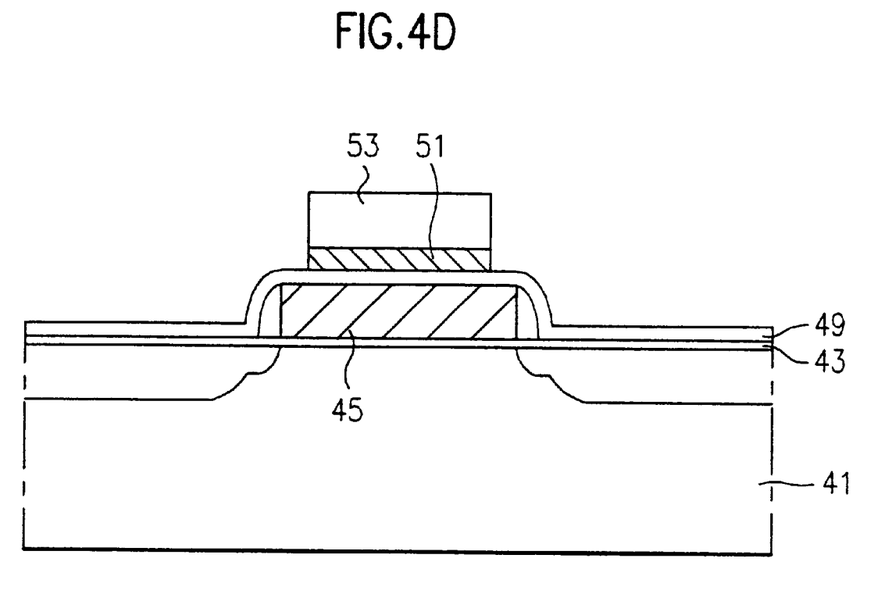
Figure 4E:
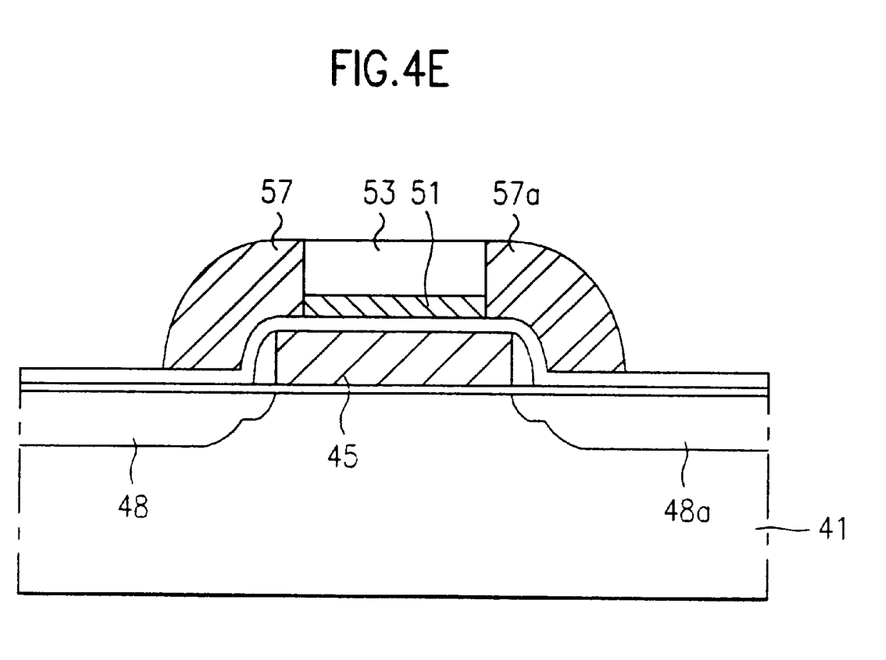

Shown in FIG. 4D the third insulating layer 53 and the semiconductor layer 51 are removed in succession to expose a surface of the second insulating layer 49 by an etching process using the patterned photoresist filter 55 as a mask. Then, as shown in FIG. 4E a polysilicon layer is formed on an entire surface of the substrate 41 inclusive of the third insulating layer 53 and etched back to form second source and drain electrodes 57 and 57a for the thin film transistor. The second source and drain electrodes 57 and 57a have a conductivity opposite to the first source and drain electrodes 47 and 47a, but identical to the semiconductor substrate 41.

Figure 4F:
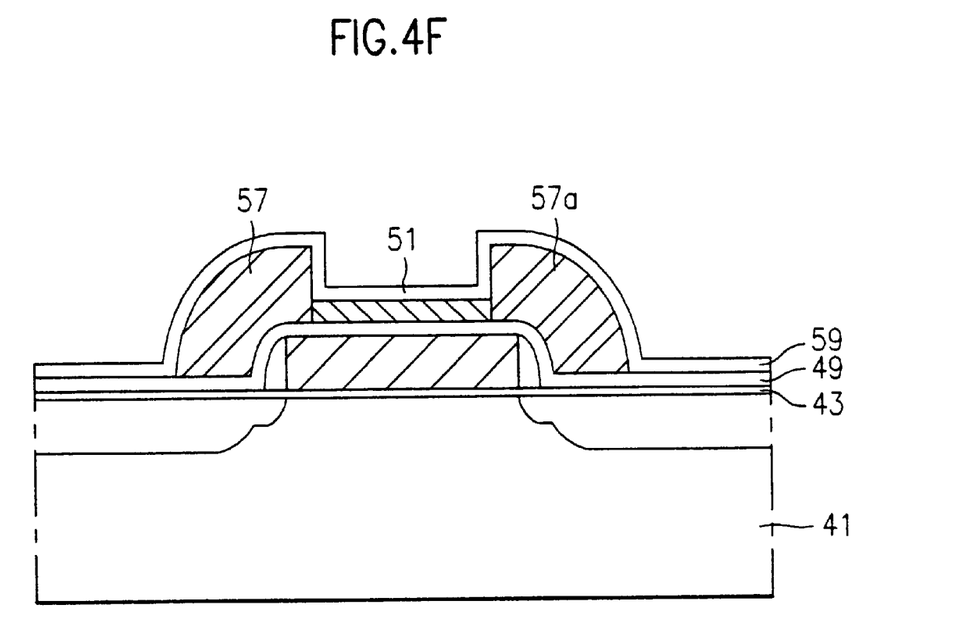
Figure 4G:
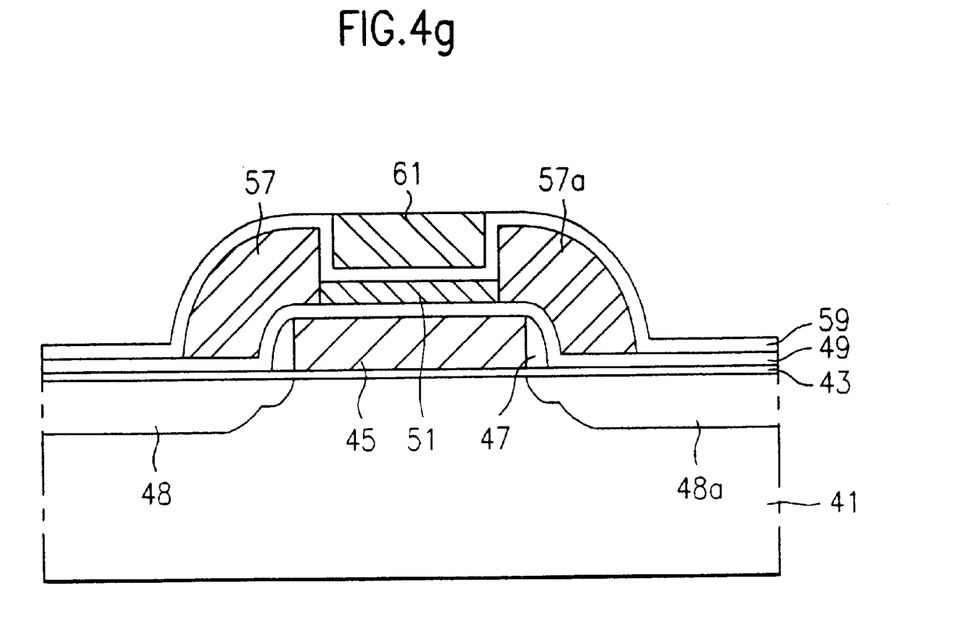

Illustrated FIG. 4F, the third insulating layer 53 is removed from top of the semiconductor layer 51 and a fourth insulating layer 59 is formed on an entire surface. The fourth insulating layer 59 is used as a gate insulating film of the thin film transistor, hereafter. Then, as shown in FIG. 4G a polysilicon layer is formed on an entire surface of the substrate 41 inclusive of the fourth insulating layer 59 and etched back to form a second gate electrode 61 over the semiconductor layer 51. The second gate electrode 61 is a gate electrode for the thin film transistor. Thus, the semiconductor device of the present invention has a semiconductor layer 51 formed between the first gate electrode 45 of the bulk transistor and the second gate electrode 61 of the bulk transistor, for using as a channel for both the bulk transistor and the thin film transistor.

As has been explained, the semiconductor device and the method for fabricating the same of the present invention have an advantage of an increased on-current of a thin film transistor as it facilitates to form a dual gate allowing to maximize a channel length.

It will be apparent to those skilled in the art that various modifications and variations can be made in the semiconductor device and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A semiconductor device comprising:

a semiconductor substrate;

a first gate electrode formed over the substrate;

a first source region defined in the substrate, the first source region positioned on one side of the first gate electrode;

a first drain region defined in the substrate, the first drain positioned on another side of the first gate electrode;

a semiconductor layer formed over the first gate electrode;

a second gate electrode formed over the semiconductor layer;

a second source region formed on a respective side of the first source; and a second drain region formed on a respective side of the first drain, wherein the second source and drain regions have a height greater than a height of the semiconductor layer.

2. A semiconductor device as claimed in claim 1, wherein the semiconductor layer has overlying and underlying insulating layers which insulate the semiconductor layer from the first and second gate electrodes.

3. A semiconductor device as claimed in claim 1, wherein the first gate electrode is a gate electrode of a bulk transistor, and the second gate electrode is a gate electrode of a thin film transistor.

4. A semiconductor device as claimed in claim 1, wherein the first source, and drain regions have a conductivity opposite to the substrate and are source and drain regions of a bulk transistor.

5. A semiconductor device as claimed in claim 1, wherein the semiconductor layer is a channel region for both a thin film transistor and a bulk transistor.

6. A semiconductor device as claimed in claim 1, wherein the second source, and drain regions are source, and drain regions of a thin film transistor and have a conductivity identical to the semiconductor substrate.

7. A semiconductor device as claimed in claim 1, wherein the semiconductor layer is a polysilicon layer.

8. A semiconductor device as claimed in claim 1, wherein an insulating layer is formed between lateral walls of the second source and drain regions and the second gate electrode.

9. A semiconductor device as claimed in claim 1, wherein an insulating layer is formed under the second gate electrode.

10. A semiconductor device as claimed in claim 1, wherein the second gate electrode is formed in between the second source and drain regions.

11. A semiconductor device comprising:
   a semiconductor substrate;
   a first gate electrode formed over the substrate;
   insulating sidewalls at both sides of the first gate electrodes;
   a first source region defined in the substrate, the first source electrode positioned on one side of the first gate electrode;
   a first drain region defined in the substrate, the first drain positioned on another side of the first gate electrode;
   a semiconductor layer formed over the first gate electrode;
   a second gate electrode formed over the semiconductor layer;
   a second source region formed on a respective side of the first source; and
   a second drain region formed on a respective side of the first drain,
   wherein the second source and drain regions have a height greater than a height of the semiconductor layer.

12. A semiconductor device as claimed in claim 11, wherein the second source, and drain regions are source, and drain regions of a thin film transistor and have a conductivity identical to the semiconductor substrate.

13. A semiconductor device as claimed in claim 11, wherein the semiconductor layer is a channel region for both a thin film transistor and a bulk transistor.

14. A semiconductor device as claimed in claim 11, wherein the first source, and drain regions have a conductivity opposite to the substrate and are source and drain regions of a bulk transistor.

15. A semiconductor device as claimed in claim 11, wherein there is an insulating layer between the second source and drain regions and the second gate electrode.

16. A semiconductor device as claimed in claim 11, wherein an insulating layer is formed between lateral walls of the second source and drain regions and the second gate electrode.

17. A semiconductor device as claimed in claim 11, wherein an insulating layer is formed under the second gate electrode.

18. A semiconductor device as claimed in claim 11, wherein the second gate electrode is formed in between the second source and drain regions.

19. A method for fabricating a semiconductor device, comprising the steps of:
   (1) forming a first gate electrode over a first insulating layer;
   (2) forming a first source and a first drain regions in the substrate on both sides of the first gate electrode;
   (3) forming a semiconductor layer over the first gate electrode with a second insulating layer therebetween;
   (4) forming a second gate electrode on the semiconductor layer; and
   (5) forming second source and drain regions having a height greater than a height of the semiconductor layer, the second source and drain regions formed at sides of the first and second gate electrodes.

20. A method as claimed in claim 19, wherein the semiconductor layer is a channel region for both a thin film transistor and a bulk transistor.

21. A method as claimed in claim 19, wherein the step (2) includes the steps of
   conducting an LDD ion injection using the first gate electrode as a mask,
   forming insulating sidewalls at both sides of the first gate electrode, and
   injecting source and drain impurities using the first gate electrode and the insulating sidewalls as masks.

22. A method as claimed in claim 19, wherein the step (5) further includes the steps of
   forming an insulating layer on the semiconductor layer, and
   forming a polysilicon layer on an entire surface inclusive of the insulating layer and etching back to leave the polysilicon layer at both sides of the second gate electrode and the first gate electrode.

23. A method as claimed in claim 19, wherein the step (4) includes the steps of
   forming a third insulating layer on the semiconductor layer and subjecting to patterning,
   selectively removing the semiconductor layer using the patterned third insulating layer as a mask,
   forming a polysilicon layer on an entire surface inclusive of the third insulating layer and etching back the polysilicon layer,
   removing the third insulating layer to expose the semiconductor layer,
   forming a fourth insulating layer on an entire surface inclusive of the exposed semiconductor layer, and
   forming a polysilicon layer on the fourth insulating layer and etching back the polysilicon layer.

24. A method as claimed in claim 23, wherein the fourth insulating layer is used as a gate insulating film of a thin film transistor.

* * * * *